United States Patent

Toguchi et al.

(10) Patent No.: US 6,682,831 B2
(45) Date of Patent: Jan. 27, 2004

(54) ORGANIC ELECTROLUMINESCENT DEVICE

(75) Inventors: Satoru Toguchi, Tokyo (JP); Hitoshi Ishikawa, Tokyo (JP); Hiroshi Tada, Tokyo (JP); Atsushi Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 75 days.

(21) Appl. No.: 09/863,465

(22) Filed: May 24, 2001

(65) Prior Publication Data

US 2002/0022150 A1 Feb. 21, 2002

(30) Foreign Application Priority Data

May 25, 2000 (JP) ........................................ 2000-155332

(51) Int. Cl.⁷ .............................................. H05B 33/12
(52) U.S. Cl. ..................... 428/690; 428/917; 313/504; 313/506
(58) Field of Search ................................ 428/690, 917; 313/504, 506

(56) References Cited

U.S. PATENT DOCUMENTS 5,443,922 A * 8/1995 Nishizaki et al. ............ 428/690

FOREIGN PATENT DOCUMENTS

| JP | 3-200889 | 9/1991 |
|----|----------|--------|
| JP | 07-138561 | 5/1995 |
| JP | 8-20771 | 1/1996 |
| JP | 08-40995 | 2/1996 |
| JP | 08-40997 | 2/1996 |
| JP | 8-53397 | 2/1996 |
| JP | 08-87122 | 4/1996 |
| JP | 08-239655 | 9/1996 |
| JP | 11-185961 | 7/1999 |
| JP | 11-195486 | 7/1999 |
| JP | 11-297473 | 10/1999 |
| JP | 2000-38353 | 2/2000 |
| JP | 2000-58261 | 2/2000 |

* cited by examiner

*Primary Examiner*—Marie Yamnitzky
(74) *Attorney, Agent, or Firm*—Young & Thompson

(57) ABSTRACT

A high-luminance organic EL device employs a particular tetrabenzo[de,hi,op,st]pentacene compound represented by the general formula (1):

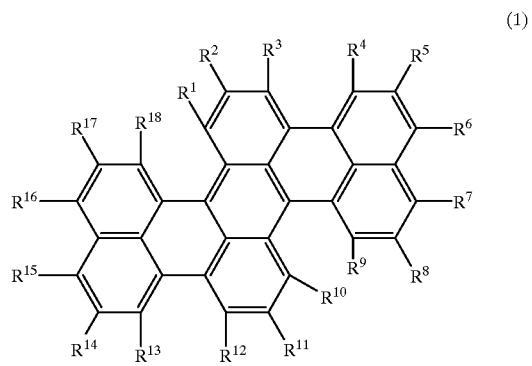

(1)

wherein $R^1$ to $R^{18}$ independently represent hydrogen atom, halogen atom, hydroxyl group, amino group, nitro group, cyano group, carboxyl group, alkyl group, alkenyl group, cycloalkyl group, alkoxy group, aromatic hydrocarbon group, aromatic heterocyclic group, aralkyl group, aryloxy group, alkoxycarbonyl group or a derivative thereof; or two of $R^1$ to $R^{18}$ may form a ring; provided that at least one of $R^1$ to $R^{18}$ is diarylamino group represented by $-NAr^1Ar^2$ where $Ar^1$ and $Ar^2$ independently represent substituted or unsubstituted aryl group having 6 to 20 carbon atoms.

4 Claims, 2 Drawing Sheets

ORGANIC ELECTROLUMINESCENT DEVICE

BACKGROUND OF THE INVENTION (1) Field of the Invention

This invention relates to an electroluminescent device with excellent luminescence properties.

(2) Description of the Prior Art

An organic electroluminescent device (hereinafter, referred to as an "EL device") is a self-light emitting device utilizing the principle that applying an electric field to a fluorescent substance causes its light emission through recombination energy of positive holes injected from an anode and electrons from a cathode. Since, based on a laminated device, C. W. Tang et al of Eastman Kodak Company reported an organic EL device driven by a low voltage (C. W. Tang, S. A. VanSlyke, Applied Physics Letters, Vol. 51, 913 (1987)), an organic EL device composed of organic materials has been intensively investigated. Tang et al. have used tris(8-hydroxyquinolinol) aluminum in a light-emitting layer and a triphenyl diamine derivative in a hole-transporting layer. A layered structure has advantages such as an improved efficiency of injecting positive holes into a light-emitting layer; an improved efficiency of generating excitons obtained from recombination, by blocking electrons injected from a cathode; and confinement of excitons generated in a light-emitting layer. As is shown above, well-known structures for an organic EL device include a two-layer type comprising a hole-transporting(injection) layer and an electron-transporting light-emitting layer, and a three-layer type comprising a hole-transporting(injection) layer, a light-emitting layer, and an electron-transporting (injection) layer. In these layered structures of devices, various device structures and manufacturing processes have been devised for improving an efficiency of recombination of injected positive holes and electrons.

As hole-transporting materials for these devices, triphenylamine derivatives and aromatic diamine derivatives such as 4,4',4"-tris(3-methylphenylphenylamino)triphenylamine, which is a star-burst molecule, and N,N'-diphenyl-N,N'-bis(3-methylphenyl)-[1,1'-biphenyl]-4,4'-diamine are well-known (e.g., Japanese Patent Laid-Open Nos. 20771/1996, 40995/1996, 40997/1996, 53397/1996, 87122/1996).

As electron-transporting materials, oxadiazole derivatives and triazole derivatives are well-known.

Known electron-transporting light-emitting materials are chelate complexes such as tris(8-quinolinolate) aluminum complex, coumarin derivatives, tetraphenylbutadiene derivatives, bisstyryl arylenes and oxadiazole derivatives. It has been reported that they may give a light-emitting color in the visible region from blue to red, and thus they are promising for realizing a color-display device (e.g., Japanese Patent Laid-Open Nos. 239655/1996, 138561/1995 and 200289/1991).

There have been recently disclosed or reported organic EL devices with a high luminance and a long life time, which are, however, not necessarily satisfactory. It has been, therefore, desired to develop materials having a high performance.

SUMMARY OF THE INVENTION

In view of the above problems, an objective of this invention is to provide an organic EL device with an improved luminance.

We have intensely investigated for solving the above problems, and have obtained the following observations on an organic EL device prepared by using particular tetrabenzopentacene derivatives having a diarylamino substituent. It has been found that the material has a good carrier transport property. It has been also found that an organic EL device prepared by using the material as a hole- or electron-transporting material, or by using a mixture layer of the above material and another hole- or electron-transporting material, may have a higher luminance than a conventional one. Furthermore, it has been found that an organic EL device may give a particularly high luminance, when employing the above diarylamino-substituted tetrabenzopentacene derivatives in which the aryl group is substituted with a styryl group as a light-emitting, hole-transporting or electron-transporting material.

This invention may be specified by the following items (1) to (8).

(1) An organic electroluminescent device having one or more organic thin layers including a light-emitting layer between an anode and a cathode, wherein at least one organic thin layer contains a material represented by the general formula (1) in a form of a mixture or a single substance:

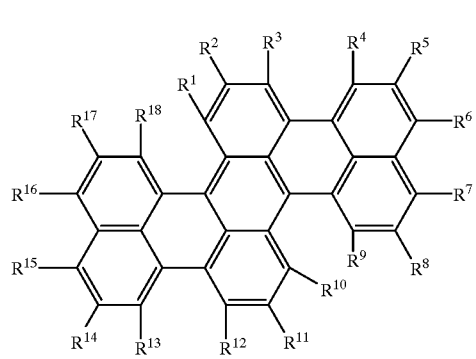

(1)

wherein $R^1$ to $R^{18}$ independently represent hydrogen atom, halogen atom, hydroxy group, a substituted or unsubstituted amino group, nitro group, cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or carboxyl group. Any two of $R^1$ to $R^{18}$ may be combined together to form a ring.

At least one of $R^1$ to $R^{18}$ is a diarylamino group represented by —$NAr^1Ar^2$ wherein $Ar^1$ and $Ar^2$ independently represent a substituted or unsubstituted aryl group having 6 to 20 carbon atoms.

(2) An organic electroluminescent device having one or more organic thin layers including a light-emitting layer between an anode and a cathode, wherein at least one organic thin layer contains a material represented by the general formula (2) in a form of a mixture or a single substance:

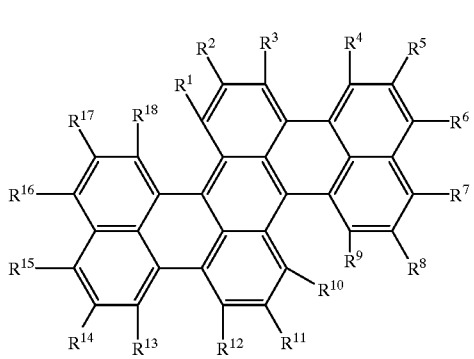

(2)

wherein $R^1$ to $R^{18}$ independently represent hydrogen atom, halogen atom, hydroxy group, a substituted or unsubstituted amino group, nitro group, cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or carboxyl group. Any two of $R^1$ to $R^{18}$ may be combined together to form a ring. provided that at least one of $R^1$ to $R^{18}$ is a diarylamino group represented by —$NAr^1Ar^2$ wherein $Ar^1$ and $Ar^2$ independently represent a substituted or unsubstituted aryl group having 6 to 20 carbon atoms and at least one of $Ar^1$ and $Ar^2$ is substituted with a substituted or unsubstituted styryl group.

(3) The organic electroluminescent device described in (1) wherein the light-emitting layer contains the compound represented by the general formula (1) in a form of a mixture or a single substance.

(4) The organic electroluminescent device described in (2) wherein the light-emitting layer contains the compound represented by the general formula (2) in a form of a mixture or a single substance.

(5) The organic electroluminescent device described in (1) wherein the organic film layer contains at least a hole-transporting layer comprising the compound represented by the general formula (1) in a form of a mixture or a single substance.

(6) The organic electroluminescent device described in (2) wherein the organic film layer contains at least a hole-transporting layer comprising the compound represented by the general formula (2) in a form of a mixture or a single substance.

(7) The organic electroluminescent device described in (1) wherein the organic film layer contains at least an electron-transporting layer comprising the compound represented by the general formula (1) in a form of a mixture or a single substance.

(8) The organic electroluminescent device described in (2) wherein the organic film layer contains at least an electron-transporting layer comprising the compound represented by the general formula (2) in a form of a mixture or a single substance.

An organic electroluminescent device according to this invention, at least one of its organic film layers comprises a particular compound represented by the general formula (1) or (2), has higher luminance than that of a conventional organic electroluminescent device.

Figure 1:
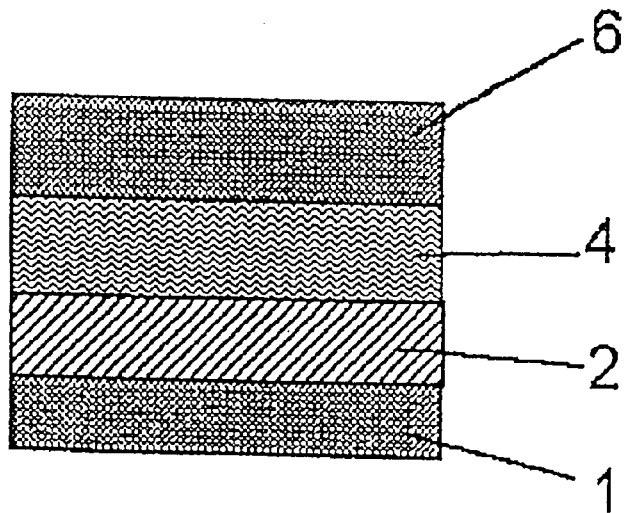
FIG. 1 is a cross section of an example of an organic EL device according to this invention.

In these figures, 1 is a substrate, 2 is an anode, 3 is a hole-transporting layer, 4 is a light-emitting layer, is an electron-transporting layer and 6 is a cathode.

DETAILED DESCRIPTION OF PREFERRED EMBODIMENTS

Although an organic electroluminescent device using a tetrabenzopentacene derivative has been disclosed in Japanese Patent Laid-Open No. 38353/2000, this invention is different from the invention described in the above laid-open disclosure in that at least one of $R^1$ to $R^{18}$ is a diarylamino group represented by —$Nar^1Ar^2$ wherein $Ar^1$ and $Ar^2$ independently represent a substituted or unsubstituted aryl group having 6 to 20 carbon atoms. In this invention, higher luminance which cannot be achieved by the prior art can be provided by using a compound with the above structure containing a diarylamino group.

Furthermore, in this invention, at least one of $Ar^1$ and $Ar^2$ may have a substituted or unsubstituted styryl group as a substituent, whereby much higher luminance may be provided.

In an organic electroluminescent device of this invention, at least one of the organic film layers comprises a compound represented by the general formula (1). $R^1$ to $R^{18}$ independently represent hydrogen atom, halogen atom, hydroxy group, a substituted or unsubstituted amino group, nitro group, cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or carboxyl group. Alternatively, any two of $R^1$ to $R^{18}$ may be combined together to form a ring. Examples of halogen atom include fluorine, chlorine, bromine and iodine. The substituted or unsubstituted amino group may be represented by —$NX^1X^2$, wherein $X^1$ and $X^2$ may be independently hydrogen, methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2- dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, 1,2,3-trinitropropyl, phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 4-styrylphenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, m-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4-methylbiphenylyl, 4"-t-butyl-p-terphenyl-4-yl, 2-pyrrolyl, 3-pyrrolyl, pyrazinyl, 2-pyridinyl, 3-pyridinyl, 4-pyridinyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 1,7-phenanthrolin-2-yl, 1,7-phenanthrolin-3-yl, 1,7-phenanthrolin-4-yl, 1,7-phenanthrolin-5-yl, 1,7-phenanthrolin-6-yl, 1,7-phenanthrolin-8-yl, 1,7-phenanthrolin-9-yl, 1,7-phenanthrolin-10-yl, 1,8-phenanthrolin-2-yl, 1,8-phenanthrolin-3-yl, 1,8-phenanthrolin-4-yl, 1,8-phenanthrolin-5-yl, 1,8-phenanthrolin-6-yl, 1,8-phenanthrolin-7-yl, 1,8-phenanthrolin-9-yl, 1,8-phenanthrolin-10-yl, 1,9-phenanthrolin-2-yl, 1,9-phenanthrolin-3-yl, 1,9-phenanthrolin-4-yl, 1,9-phenanthrolin-5-yl, 1,9-phenanthrolin-6-yl, 1,9-phenanthrolin-7-yl, 1,9-phenanthrolin-8-yl, 1,9-phenanthrolin-10-yl, 1,10-phenanthrolin-2-yl, 1,10-phenanthrolin-3-yl, 1,10-phenanthrolin-4-yl, 1,10-phenanthrolin-5-yl, 2,9-phenanthrolin-1-yl, 2,9-phenanthrolin-3-yl, 2,9-phenanthrolin-4-yl, 2,9-phenanthrolin-5-yl, 2,9-phenanthrolin-6-yl, 2,9-phenanthrolin-7-yl, 2,9-phenanthrolin-8-yl, 2,9-phenanthrolin-10-yl, 2,8-phenanthrolin-1-yl, 2,8-phenanthrolin-3-yl, 2,8-phenanthrolin-4-yl, 2,8-phenanthrolin-5-yl, 2,8-phenanthrolin-6-yl, 2,8-phenanthrolin-7-yl, 2,8-phenanthrolin-9-yl, 2,8-phenanthrolin-10-yl, 2,7-phenanthrolin-1-yl, 2,7-phenanthrolin-3-yl, 2,7-phenanthrolin-4-yl, 2,7-phenanthrolin-5-yl, 2,7-phenanthrolin-6-yl, 2,7-phenanthrolin-8-yl, 2,7-phenanthrolin-9-yl, 2,7-phenanthrolin-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-t-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl or 4-t-butyl-3-indolyl group.

Examples of the substituted or unsubstituted alkyl group include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl and 1,2,3-trinitropropyl group. Examples of the substituted or unsubstituted alkenyl group include vinyl, allyl, 1-butenyl, 2-butenyl, 3-butenyl, 1,3-butadienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl and 3-phenyl-1-butenyl group. Examples of the substituted or unsubstituted cycloalkyl group include cyclopropyl, cyclobutyl, cyclopentyl, cyclohexyl and 4-methylcyclohexyl group. The substituted or unsubstituted alkoxy group is represented by —OY, wherein Y may be methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl or 1,2,3-trinitropropyl group. Examples of the substituted or unsubstituted aromatic hydrocarbon group include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl and 4"-t-butyl-p- terphenyl-4-yl group. Examples of the substituted or unsubstituted aromatic heterocyclic group include 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, 1-phenanthridinyl, 2-phenanthridinyl, 3-phenanthridinyl, 4-phenanthridinyl, 6-phenanthridinyl, 7-phenanthridinyl, 4-phenanthridinyl, 9-phenanthridinyl, 10-phenanthridinyl, 1-acridinyl, 2-acridinyl, 3-acridinyl, 4-acridinyl, 9-acridinyl, 1,7-phenanthrolin-2-yl, 1,7-phenanthrolin-3-yl, 1,7-phenanthrolin-4-yl, 1,7-phenanthrolin-5-yl, 1,7-phenanthrolin-6-yl, 1,7-phenanthrolin-8-yl, 1,7-phenanthrolin-9-yl, 1,7-phenanthrolin-10-yl, 1,8-phenanthrolin-2-yl, 1,8-phenanthrolin-3-yl, 1,8-phenanthrolin-4-yl, 1,8-phenanthrolin-5-yl, 1,8-phenanthrolin-6-yl, 1,8-phenanthrolin-7-yl, 1,8-phenanthrolin-9-yl, 1,8-phenanthrolin-10-yl, 1,9-phenanthrolin-2-yl, 1,9-phenanthrolin-3-yl, 1,9-phenanthrolin-4-yl, 1,9-phenanthrolin-5-yl, 1,9-phenanthrolin-6-yl, 1,9-phenanthrolin-7-yl, 1,9-phenanthrolin-8-yl, 1,9-phenanthrolin-10-yl, 1,10-phenanthrolin-2-yl, 1,10-phenanthrolin-3-yl, 1,10-phenanthrolin-4-yl, 1,10-phenanthrolin-5-yl, 2,9-phenanthrolin-1-yl, 2,9-phenanthrolin-3-yl, 2,9-phenanthrolin-4-yl, 2,9-phenanthrolin-5-yl, 2,9-phenanthrolin-6-yl, 2,9-phenanthrolin-7-yl, 2,9-phenanthrolin-8-yl, 2,9-phenanthrolin-10-yl, 2,8-phenanthrolin-1-yl, 2,8-phenanthrolin-3-yl, 2,8-phenanthrolin-4-yl, 2,8-phenanthrolin-5-yl, 2,8-phenanthrolin-6-yl, 2,8-phenanthrolin-7-yl, 2,8-phenanthrolin-9-yl, 2,8-phenanthrolin-10-yl, 2,7-phenanthrolin-1-yl, 2,7-phenanthrolin-3-yl, 2,7-phenanthrolin-4-yl, 2,7-phenanthrolin-5-yl, 2,7-phenanthrolin-6-yl, 2,7-phenanthrolin-8-yl, 2,7-phenanthrolin-9-yl, 2,7-phenanthrolin-10-yl, 1-phenazinyl, 2-phenazinyl, 1-phenothiazinyl, 2-phenothiazinyl, 3-phenothiazinyl, 4-phenothiazinyl, 10l-phenothiazinyl, 1-phenoxazinyl, 2-phenoxazinyl, 3-phenoxazinyl, 4-phenoxazinyl, 10-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-t-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl and 4-t-butyl-3-indolyl group. Examples of the substituted or unsubstituted aralkyl group include benzyl, 1-phenylethyl, 2-phenylethyl, 1-phenylisopropyl, 2-phenylisopropyl, phenyl-t-butyl, α-naphthylmethyl, 1-α-naphthylethyl, 2-α-naphthylethyl, 1-α-naphthylisopropyl, 2-α-naphthylisopropyl, β-naphthylmethyl, 1-β-naphthylethyl, 2-p-naphthylethyl, 1-β-naphthylisopropyl, 2-β-naphthylisopropyl, 1-pyrrolylmethyl, 2-(1-pyrrolyl)ethyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydoxy-2-phenylisopropyl and 1-chloro-2-phenylisopropyl group. The substituted or unsubstituted aryloxy group is represented by —OZ, wherein Z may be phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-pyrrolyl, 3-pyrrolyl, pyrazinyl, 2-pyridinyl, 3-pyridinyl, 4-pyridinyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-iso quinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthrid in yl, 1-acridinyl, 2-acridinyl, 3-acrid inyl, 4-acridinyl, 9-acridinyl, 1,7-phenanthrolin-2-yl, 1,7-phenanthrolin-3-yl, 1,7-phenanthrolin-4-yl, 1,7-phenanthrolin-5-yl, 1,7-phenanthrolin-6-yl, 1,7-phenanthrolin-8-yl, 1,7-phenanthrolin-9-yl, 1,7-phenanthrolin-10-yl, 1,8-phenanthrolin-2-yl, 1,8-phenanthrolin-3-yl, 1,8-phenanthrolin-4-yl, 1,8-phenanthrolin-5-yl, 1,8-phenanthrolin-6-yl, 1,8-phenanthrolin-7-yl, 1,8-phenanthrolin-9-yl, 1,8-phenanthrolin-10-yl, 1,9-phenanthrolin-2-yl, 1,9-phenanthrolin-3-yl, 1,9-phenanthrolin-4-yl, 1,9-phenanthrolin-5-yl, 1,9-phenanthrolin-6-yl, 1,9-phenanthrolin-7-yl, 1,9-phenanthrolin-8-yl, 1,9-phenanthrolin-10-yl, 1,10-phenanthrolin-2-yl, 1,10-phenanthrolin-3-yl, 1,10-phenanthrolin-4-yl, 1,10-phenanthrolin-5-yl, 2,9-phenanthrolin-1-yl, 2,9-phenanthrolin-3-yl, 2,9-phenanthrolin-4-yl, 2,9-phenanthrolin-5-yl, 2,9-phenanthrolin-6-yl, 2,9-phenanthrolin-7-yl, 2,9-phenanthrolin-8-yl, 2,9-phenanthrolin-10-yl, 2,8-phenanthrolin-1-yl, 2,8-phenanthrolin-3-yl, 2,8-phenanthrolin-4-yl, 2,8-phenanthrolin-5-yl, 2,8-phenanthrolin-6-yl, 2,8-phenanthrolin-7-yl, 2,8-phenanthrolin-9-yl, 2,8-phenanthrolin-10-yl, 2,7-phenanthrolin-1-yl, 2,7-phenanthrolin-3-yl, 2,7-phenanthrolin-4-yl, 2,7-phenanthrolin-5-yl, 2,7-phenanthrolin-6-yl, 2,7-phenanthrolin-8-yl, 2,7-phenanthrolin-9-yl, 2,7-phenanthrolin-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-t-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl or 4-t-butyl-3-indolyl group. The substituted or unsubstituted alkoxycarbonyl group is represented by —COOY, wherein Y may be methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl or 1,2,3-trinitropropyl group.

Bivalent groups which may form a ring include tetramethylene, pentamethylene, hexamethylene, diphenylmethan-2,2'-diyl, diphenylethan-3,3'-diyl and diphenylpropan-4,4'-diyl group.

At least one of $R^1$ to $R^{18}$ is —$NAr^1Ar^2$ wherein $Ar^1$ and $Ar^2$ independently represent a substituted or unsubstituted aryl group having 6 to 20 carbon atoms. Examples of the aryl group having 6 to 20 carbon atoms include phenyl, naphthyl, anthryl, phenanthryl, naphthacenyl and pyrenyl group. These aryl groups may be substituted with a halogen, hydroxy group, the above substituted or unsubstituted amino group, nitro group, cyano group, the above substituted or unsubstituted alkyl group, the above substituted or unsubstituted alkenyl group, the above substituted or unsubstituted cycloalkyl group, the above substituted or unsubstituted alkoxy group, the above substituted or unsubstituted aromatic hydrocarbon group, the above substituted or unsubstituted aromatic heterocyclic group, the above substituted or unsubstituted aralkyl group, the above substituted or unsubstituted aryloxy group, the above substituted or unsubstituted alkoxycarbonyl group, or carboxyl group.

In an organic electroluminescent device of this invention, at least one of the organic film layers may comprise a compound represented by the general formula (2). In the general formula (2), $R^1$ to $R^{18}$ independently represent hydrogen, halogen atom, hydroxy group, the above substituted or unsubstituted amino group, nitro group, cyano group, the above substituted or unsubstituted alkyl group, the above substituted or unsubstituted alkenyl group, the above substituted or unsubstituted cycloalkyl group, the above substituted or unsubstituted alkoxy group, the above substituted or unsubstituted aromatic hydrocarbon group, the above substituted or unsubstituted aromatic heterocyclic group, the above substituted or unsubstituted aralkyl group, the above substituted or unsubstituted aryloxy group, the above substituted or unsubstituted alkoxycarbonyl group, or carboxyl group. Alternatively, two of $R^1$ to $R^{18}$ may be combined together to form a ring.

The styryl group which $Ar_1^1$ and $Ar^2$ have as a substituent, may be selected from unsubstituted styryl group, 2,2-diphenylvinyl group, 1,2,2-triphenylvinyl group as well as substituted styryl group and substituted 2,2-diphenylvinyl groups whose terminal phenyl group or vinyl carbon can have substituents such as a halogen atom, hydroxy group, the above substituted or unsubstituted amino group, nitro group, cyano group, the above substituted or unsubstituted alkyl group, the above substituted or unsubstituted alkenyl group, the above substituted or unsubstituted cycloalkyl group, the above substituted or unsubstituted alkoxy group, the above substituted or unsubstituted aromatic hydrocarbon group, the above substituted or unsubstituted aromatic heterocyclic group, the above substituted or unsubstituted aralkyl group, the above substituted or unsubstituted aryloxy group, the above substituted or unsubstituted alkoxycarbonyl group and carboxyl group.

Examples of a compound of this invention will be shown below, to which this invention is not limited.

(3)

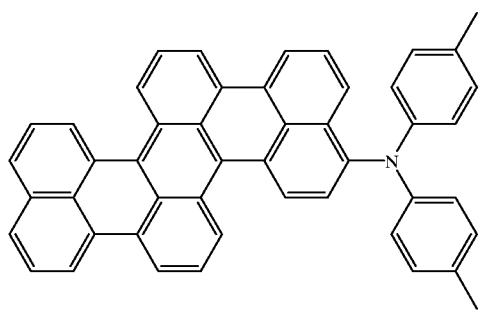

-continued
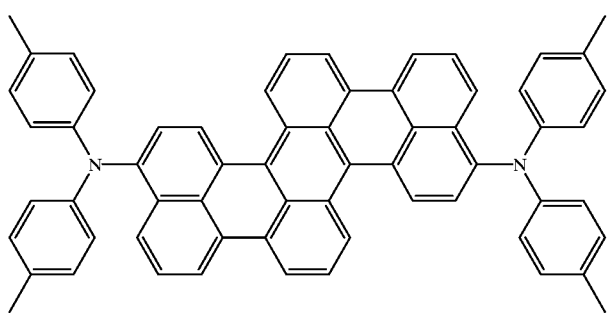
(4)
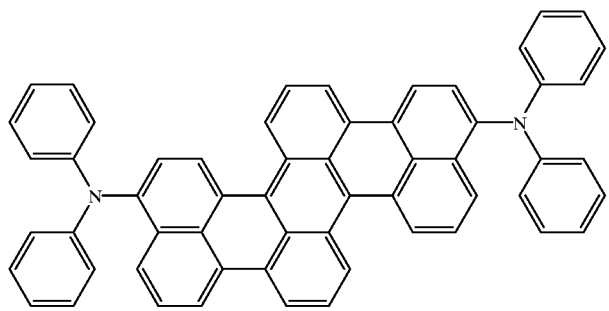
(5)
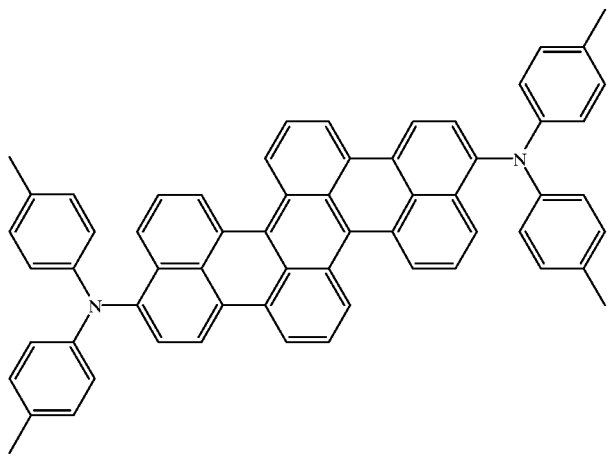
(6)
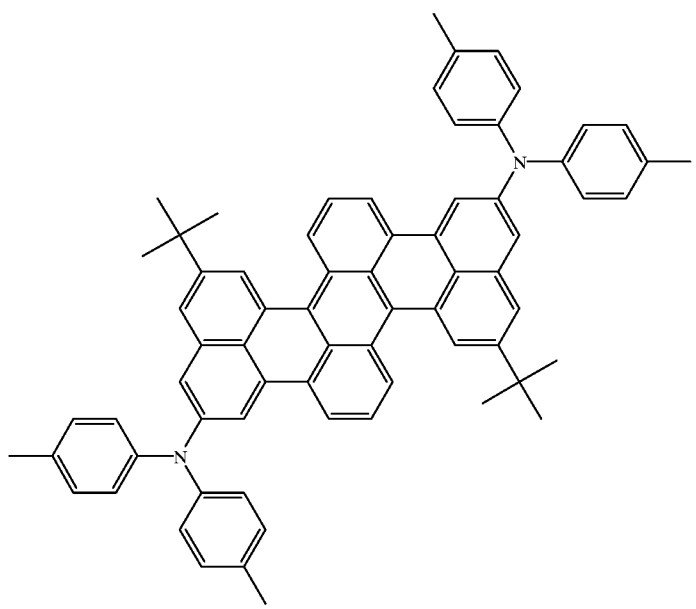
(7)

-continued
(8)
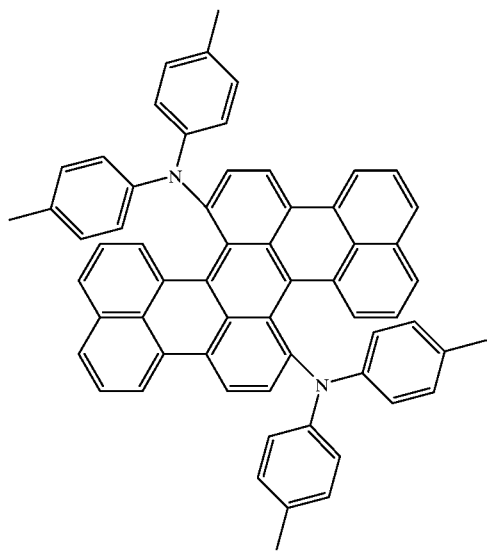
(9)
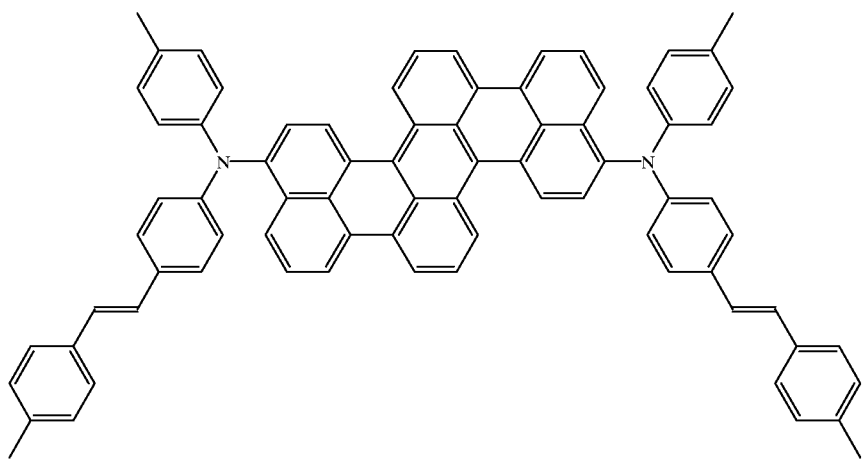
(10)
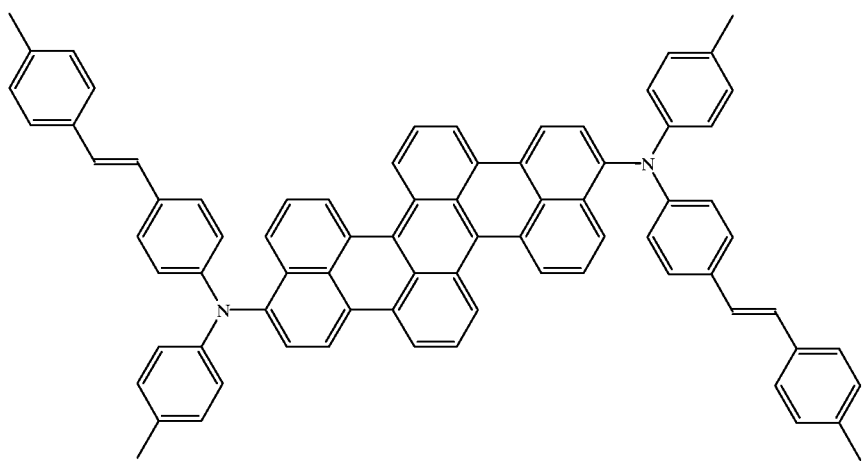

-continued
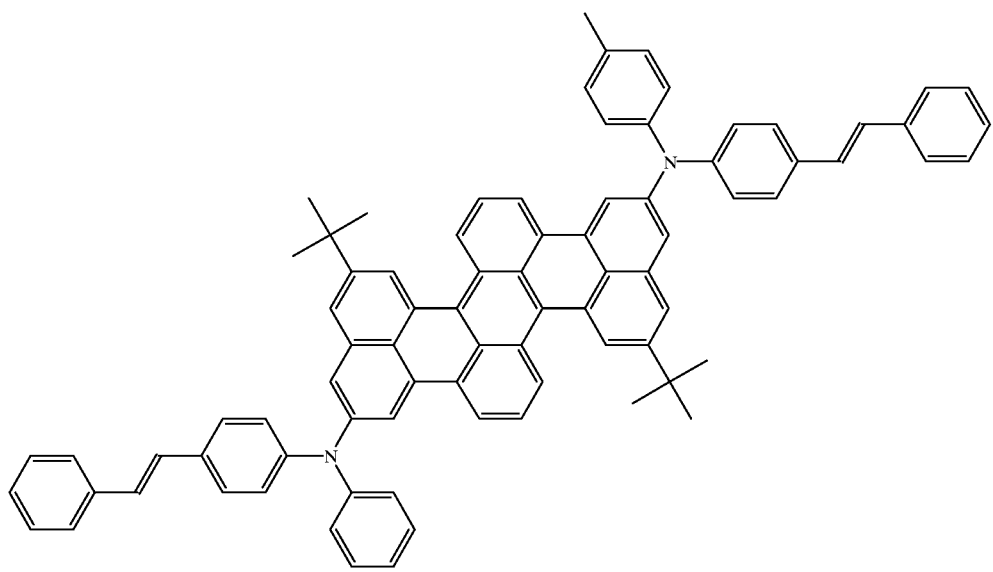
(11)
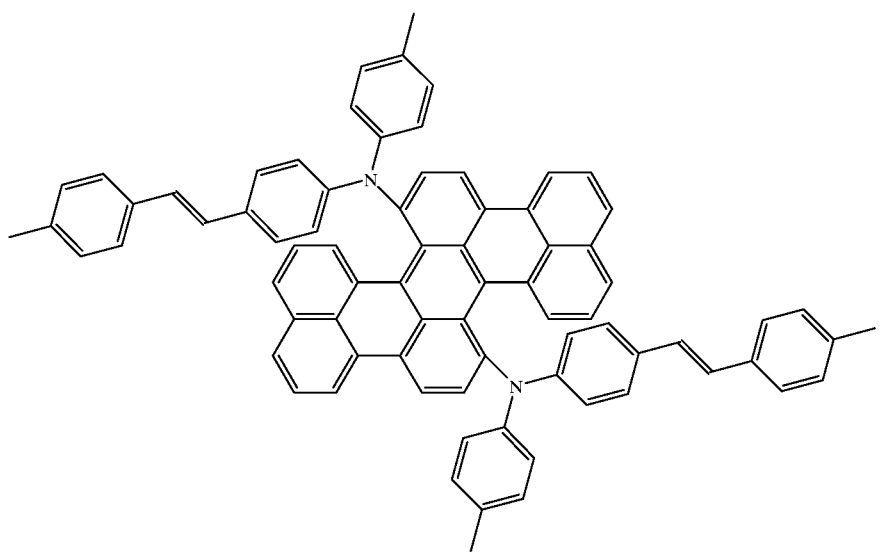
(12)
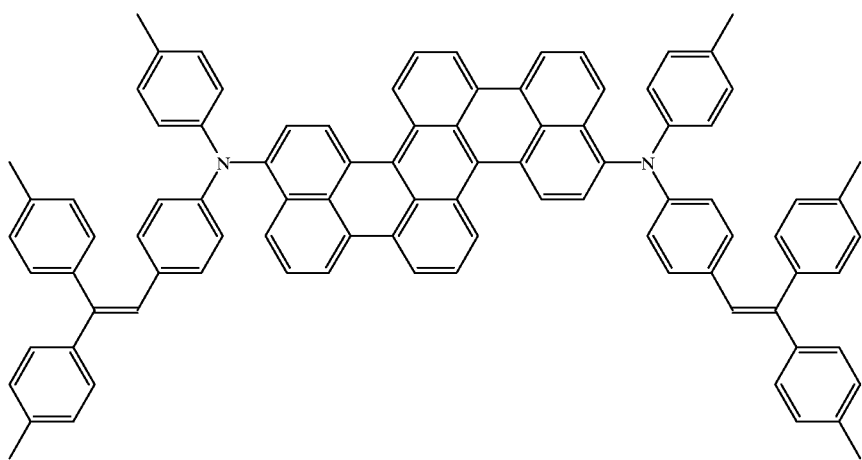
(13)

-continued
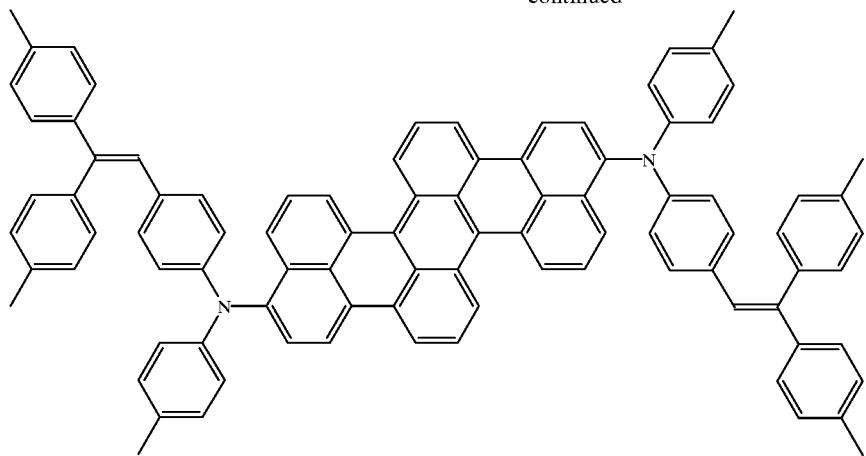
(14)
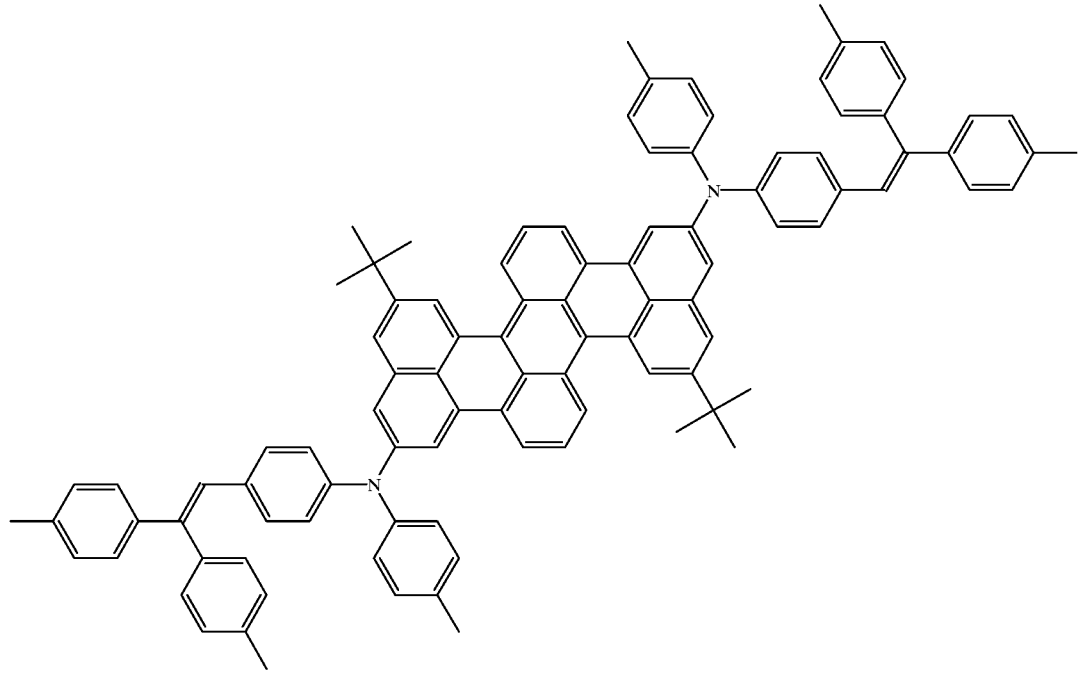
(15)
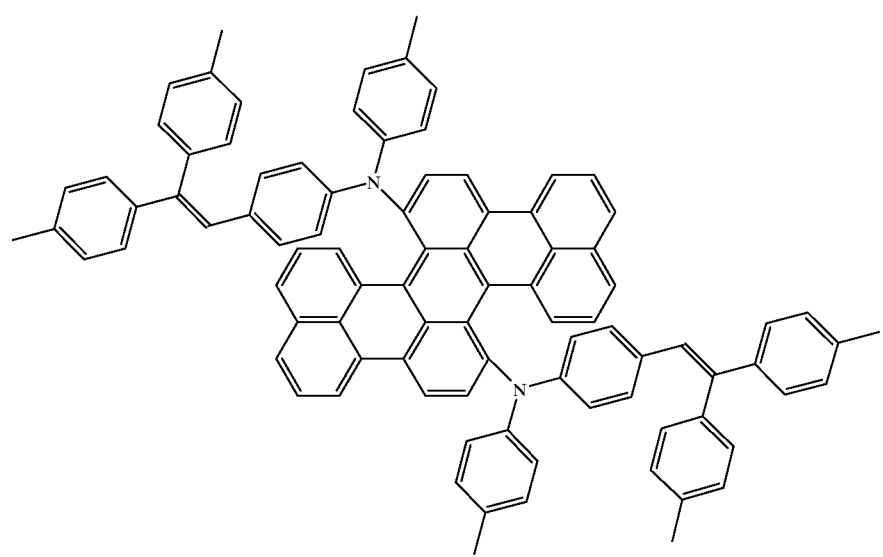
(16)

-continued
(17)
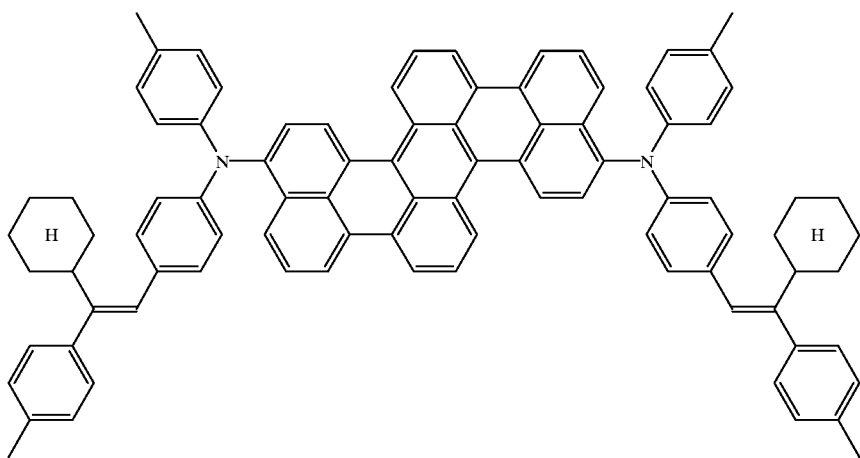
(18)
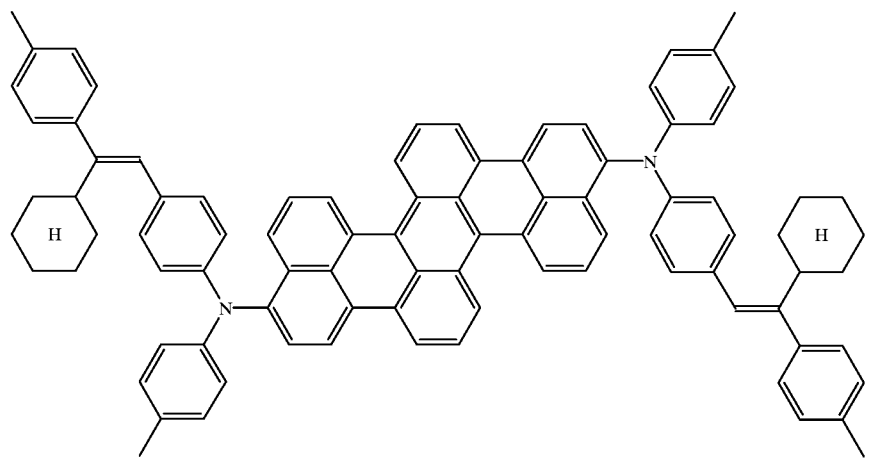
(19)
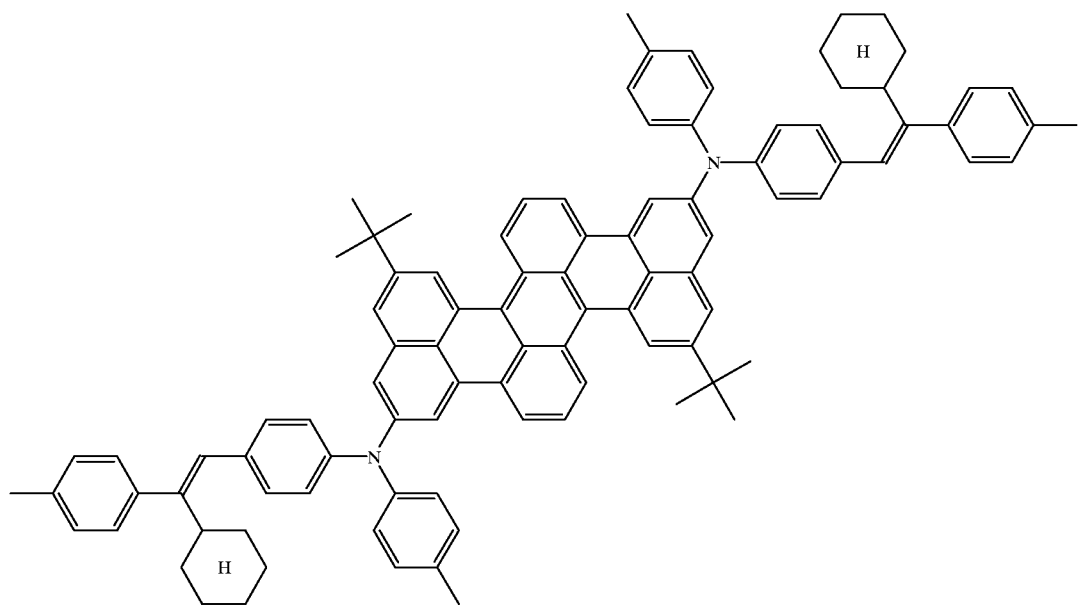

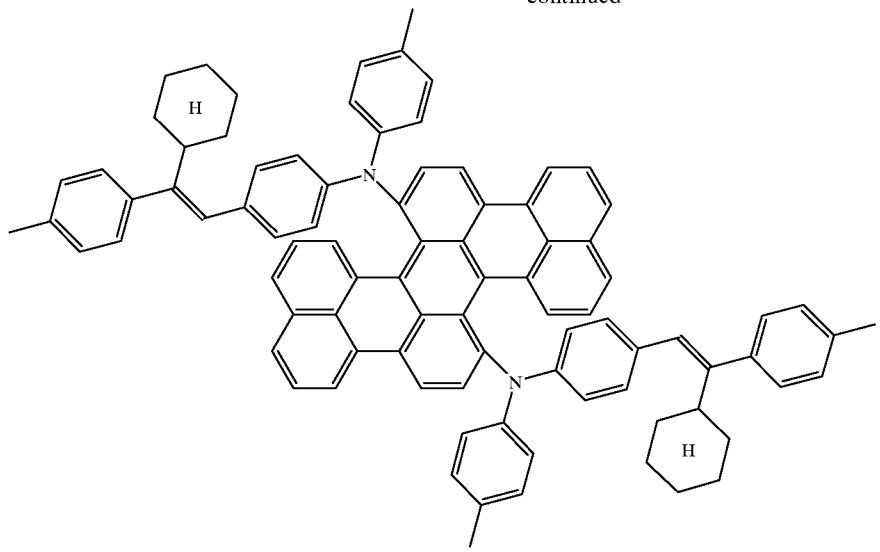
(20)

An organic EL device of this invention has one or more organic layers between electrodes. For example, it may have a layered structure as shown in FIGS. 1 to 4 consisting of i) an anode, a light-emitting layer and a cathode; ii) an anode, a hole-transporting layer, a light-emitting layer, an electron-transporting layer and a cathode; iii) an anode, a hole-transporting layer, a light-emitting layer and a cathode; or iv) an anode, a light-emitting layer, an electron-transporting layer and a cathode.

The compound in this invention can be applied to any of the above organic layers, and can be added as a dopant in another hole-transporting, light-emitting or electron-transporting material.

There is no limitation for a hole-transporting material used in this invention, and thus any compound ordinarily used as a hole-transporting material can be employed. Examples of the hole-transporting material include triphenyldiamines such as bis(di(p-tolyl)aminophenyl)-1,1-cyclohexane[01], N,N'-diphenyl-N,N'-bis(3-methylphenyl)-1,1'-biphenyl-4,4'-diamine[02] and N,N'-diphenyl-N,N-bis(1-naphthyl)-1,1'-biphenyl-4,4'-diamine[03], and star-burst type molecules(e.g., [04] to [06]).

[01]

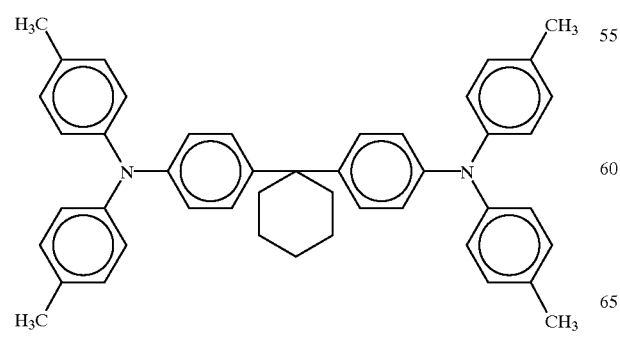

[02]

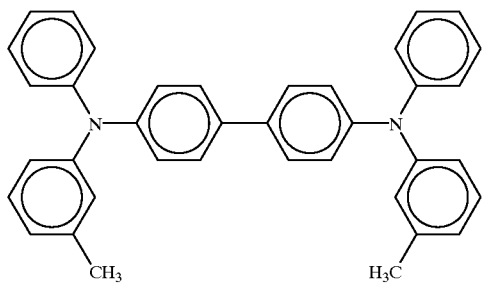

[03]

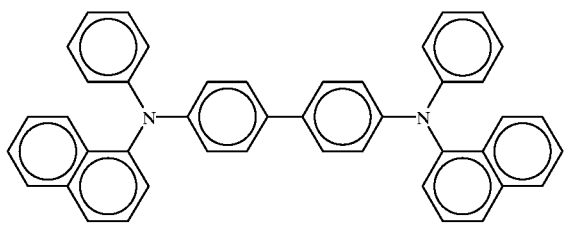

[04]

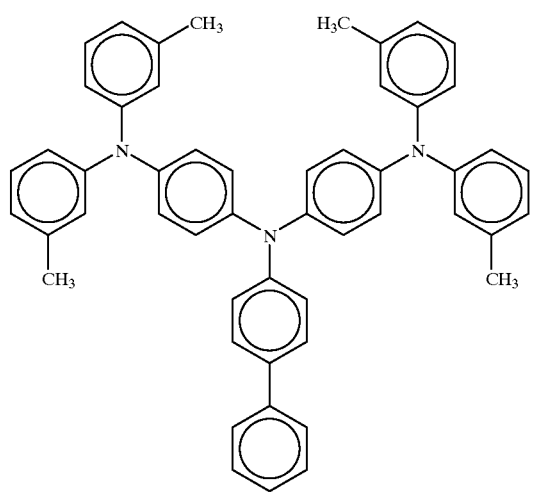

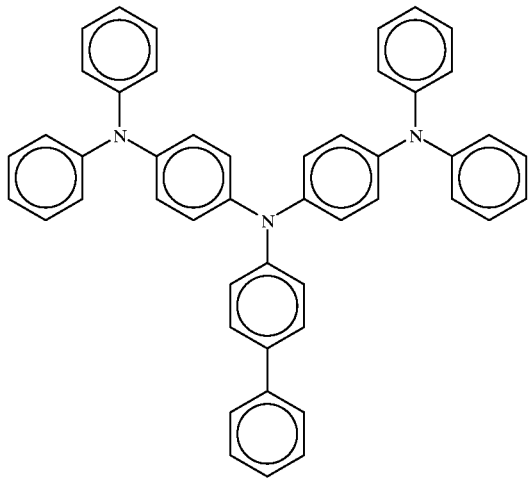

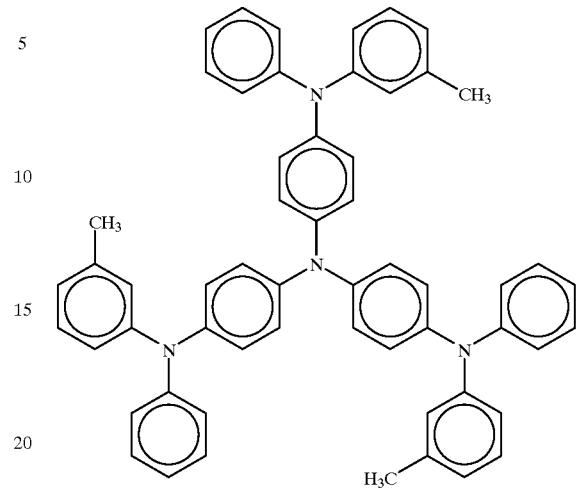

There is no limitation for an electron-transporting material used in this invention, and thus any compound ordinarily used as an electron-transporting material can be employed. Examples include oxadiazoles such as 2-(4-biphenylyl)-5-(4-t-butylphenyl)-1,3,4-oxadiazole [07] and bis{2-(4-t-butylphenyl)-1,3,4-oxadiazole}-m-phenylene [08]; triazoles such as [09] and [10]; and quinolinolate metal complexes such as [11] to [14].

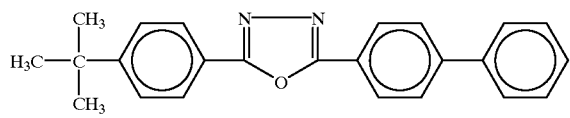

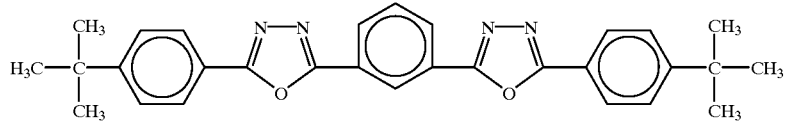

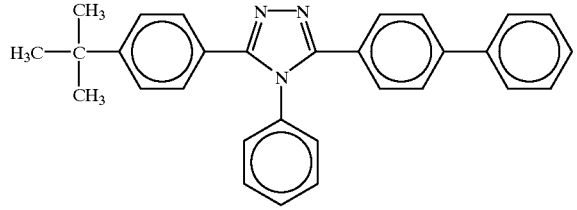

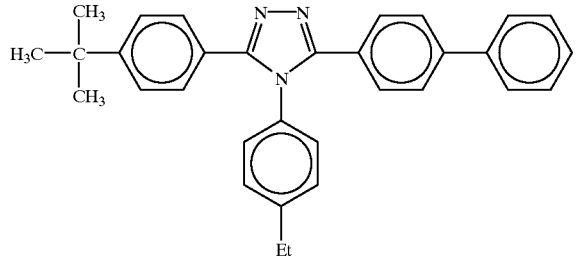

-continued

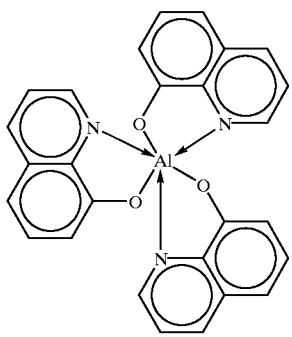

[11]

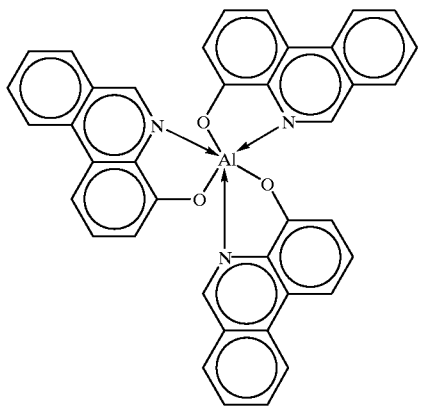

[12]

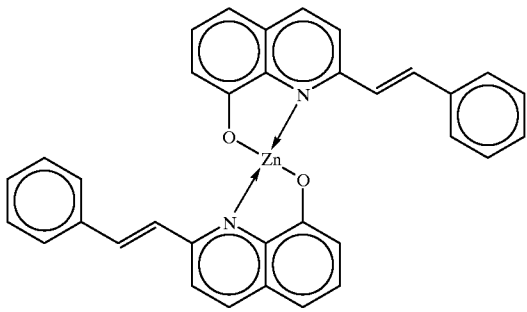

[13]

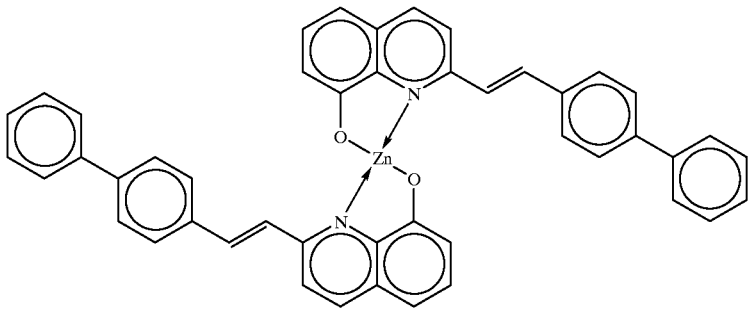

[14]

An anode of an organic EL device injects positive holes into a hole-transporting layer or a light-emitting layer. It is, therefore, effective for the anode to have a work function of at least 4.5 eV. Examples of an anode material used in this invention are indium oxide-tin alloy (ITO), stannic oxide (NESA), gold, silver, platinum and copper. Since a cathode has a role of injecting electrons into an electron-transporting or light-emitting layer, it preferably has a lower work function. Examples of a cathode material are, but not limited to, indium, aluminum, magnesium, magnesium-indium alloy, magnesium-aluminum alloy, aluminum-lithium alloy, aluminum-scandium-lithium alloy, and magnesium-silver alloy.

Each layer of an organic EL device according to this invention may be formed by a known process such as, but not limited to, vacuum evaporation and spin coating. An organic thin layer used in an organic EL device according to this invention, which contains a compound represented by the general formula (1) or (2), may be formed by a known process such as vacuum evaporation, molecular-beam evaporation (MBE) and application of a solution, e.g., dipping, spin coating, casting, bar coating and roll coating.

There are no limitation for a thickness of each organic layer of an organic EL device according to this invention. However, in general, an excessively thin layer tends to cause defects such as a pin hole, while an excessively thick layer may require higher applied voltage, resulting in a lower efficiency. The thickness is, therefore, preferably several nanometers to 1 μm.

This invention will be specifically described with the following examples, but is not limited to the examples, unless departing from its spirit and scope.

SYNTHESIS EXAMPLE 1

Synthesis of Compound (3) (4-ditolylaminotetrabenzo[de,hi,op,st]pentacene)

In a three-necked flask were placed 4-chlorotetrabenzo[de,hi,op,st]pentacene, one equivalent of di-p-tolylamine, one equivalent of potassium carbonate, copper powder and nitrobenzene and the mixture was stirred at 200° C. for 30 hours. At the end of the reaction, toluene was added to the mixture. The mixture was filtered to remove inorganic components. After evaporation of toluene and nitrobenzene in vacuo, the residue was purified in accordance with an ordinary method to obtain the title compound 4-ditolylaminotetrabenzo[de,hi,op,st]pentacene.

SYNTHESIS EXAMPLE 2

Synthesis of Compound (4) (4,13-bis(ditolylamino)tetrabenzo[de,hi,op,st]pentacene)

In a three-necked flask were placed 4,13-dichlorotetrabenzo[de,hi,op,st]pentacene, two equivalents of di-p-tolylamine, two equivalents of potassium carbonate, copper powder and nitrobenzene and the mixture was stirred at 200° C. for 30 hours. At the end of the reaction, toluene was added to the mixture. The mixture was filtered to remove inorganic components. After evaporation of toluene and nitrobenzene in vacuo, the residue was purified in accordance with an ordinary method to obtain the title compound 4,13-bis(ditolylamino)tetrabenzo[de,hi,op,st]pentacene.

SYNTHESIS EXAMPLE 3

Synthesis of Compound (5) (3,12-is(diphenylamino)tetrabenzo[de,hi,op,st]pentacene)

The title compound 3,12-bis(diphenylamino)tetrabenzo[de,hi,op,st]pentacene was obtained as described in Synthesis Example 2, except that di-p-tolylamine was replaced with diphenylamine.

SYNTHESIS EXAMPLE 4

Synthesis of Compound (6) (3,12-bis(ditolylamino)tetrabenzo[de,hi,op,st]pentacene)

The title compound 3,12-bis(ditolylamino)tetrabenzo[de,hi,op,st]pentacene was obtained as described in Synthesis Example 2, except that 4,13-dichlorotetrabenzo[de,hi,op,st]pentacene was replaced with 3,12-dichlorotetrabenzo[de,hi,op,st]pentacene.

SYNTHESIS EXAMPLE 5

Synthesis of Compound (7) (2,11-bis(ditolylamino)-5,14-di-t-butyltetrabenzo[de,hi,op,st]pentacene)

The title compound 2,11-bis(ditolylamino)-5,14-di-t-butyltetrabenzo[de,hi,op,st]pentacene was obtained as described in Synthesis Example 2, except that 4,13-dichlorotetrabenzo [de,hi,op, st]pentacene was replaced with 5,14-di-t-butyl-2,11-dichlorotetrabenzo[de,hi,op,st]pentacene.

SYNTHESIS EXAMPLE 6

Synthesis of Compound (9) (4,13-bis(N-tolyl-N-4-(p-tolylvinyl)phenylamino)tetrabenzo[de,hi,op,st]pentacene)

The title compound 4,13-bis(N-tolyl-N-4-(p-tolylvinyl)phenylamino)tetrabenzo[de,hi,op,st]pentacene was obtained as described in Synthesis Example 2, except that di-p-tolylamine was replaced with N-tolyl-N-4-(p-tolylvinyl)phenylamine.

SYNTHESIS EXAMPLE 7

Synthesis of Compound (10) (3,12-bis(N-tolyl-N-4-(p-tolylvinyl)phenylamino)tetrabenzo[de,hi,op,st]pentacene)

The title compound 3,12-bis(N-tolyl-N-4-(p-tolylvinyl)phenylamino)tetrabenzo[de,hi,op,st]pentacene was obtained as described in Synthesis Example 4, except that di-p-tolylamine was replaced with N-tolyl-N-4-(p-tolylvinyl)phenylamine.

SYNTHESIS EXAMPLE 8

Synthesis of Compound (11) (2,11-bis(N-tolyl-N-4-(p-tolylvinyl)phenylamino)-5,14-di-t-butyltetrabenzo [de,hi,op,st]pentacene)

The title compound 2,11-bis(N-tolyl-N-4-(p-tolylvinyl)phenylamino)-5,14-di-t-butyltetrabenzo[de,hi,op,st]pentacene was obtained as described in Synthesis Example 5, except that di-p-tolylamine was replaced with N-tolyl-N-4-(p-tolylvinyl)phenylamine.

SYNTHESIS EXAMPLE 9

Synthesis of Compound (13) (4,13-bis(N-tolyl-N-4-(di-p-tolylvinyl)phenylamino)tetrabenzo[de,hi,op,st]pentacene)

The title compound 4,13-bis(N-tolyl-N-4-(di-p-tolylvinyl) phenylamino)tetrabenzo[de,hi,op,st]pentacene was obtained as described in Synthesis Example 2, except that di-p-tolylamine was replaced with N-tolyl-N-4-(di-p-tolylvinyl)phenylamine.

SYNTHESIS EXAMPLE 10

Synthesis of Compound (14) (3,12-bis(N-tolyl-N-4-(di-p-tolylvinyl)phenylamino)tetrabenzo[de,hi,op,st]pentacene)

The title compound 3,12-bis(N-tolyl-N-4-(di-p-tolylvinyl)phenylamino)tetrabenzo[de,hi,op,st]pentacene was obtained as described in Synthesis Example 4, except that di-p-tolylamine was replaced with N-tolyl-N-4-(di-p-tolylvinyl)phenylamine.

SYNTHESIS EXAMPLE 11

Synthesis of Compound (15) (2,11-bis(N-tolyl-N-4-(di-p-tolylvinyl)phenylamino)-5,14-di-t-butyltetrabenzo[de,hi,op,st]pentacene)

The title compound 2,11-bis(N-tolyl-N-4-(di-p-tolylvinyl)phenylamino)5,14-di-t-butyltetrabenzo[de,hi,op,st]pentacene was obtained as described in Synthesis Example 5, except that di-p-tolylamine was replaced with N-tolyl-N-4-(di-p-tolylvinyl)phenylamine.

SYNTHESIS EXAMPLE 12

Synthesis of Compound (17) (4,13-bis(N-tolyl-N-4-(cyclohexyl-p-tolylvinyl)phenylamino)tetrabenzo [de,hi,op,st]pentacene)

The title compound 4,13-bis(N-tolyl-N-4-(cyclohexyl-p-tolylvinyl)phenylamino)tetrabenzo[de,hi,op,st]pentacene was obtained as described in Synthesis Example 2, except that di-p-tolylamine was replaced with N-tolyl-N-4-(cyclohexyl-p-tolylvinyl)phenylamine.

SYNTHESIS EXAMPLE 13

Synthesis of Compound (18) (3,12-bis(N-tolyl-N-4-(cyclohexyl-p-tolylvinyl)phenylamino)tetrabenzo [de,hi,op,st]pentacene)

The title compound 3,12-bis(N-tolyl-N-4-(cyclohexyl-p-tolylvinyl)phenylamino) tetrabenzo[de,hi,op,st]pentacene was obtained as described in Synthesis Example 4, except that di-p-tolylamine was replaced with N-tolyl-N-4-(cyclohexyl-p-tolylvinyl)phenylamine.

SYNTHESIS EXAMPLE 14

Synthesis of Compound (19) (2,11-bis(N-tolyl-N-4-(cyclohexyl-p-tolylvinyl) phenylamino)-5,14-di-t-butyltetrabenzo[de,hi,op,st]pentacene)

The title compound 2,11-bis(N-tolyl-N-4-(cyclohexyl-p-tolylvinyl) phenylamino)-5,14-di-t-butyltetrabenzo[de,hi,op,st]pentacene was obtained as described in Synthesis Example 5, except that di-p-tolylamine was replaced with N-tolyl-N-4-(cyclohexyl-p-tolylvinyl)phenylamine.

EXAMPLE 1

FIG. 1 shows a cross section of the device employed in Example 1. A procedure for preparing an organic EL device in Example 1 of this invention will be described. The device is composed of an anode/a light-emitting layer/a cathode. On a glass substrate, ITO was deposited as an anode by spattering, with a sheet resistance of 20 $\Omega/\square$. On the anode, 40 nm thick light-emitting layer was formed by vacuum deposition of Compound (3). Then, 200 nm thick cathode was formed by vacuum deposition of magnesium-silver alloy, to fabricate an organic EL device. Applying 5 V DC to the device generated a light emission of 20 cd/m².

EXAMPLE 2

An organic EL device was obtained as described in Example 1, except using Compound (4) as a light-emitting material. Applying 5 V DC to the device generated a light emission of 110 cd/m².

EXAMPLE 3

An organic EL device was obtained as described in Example 1, except using Compound (5) as a light-emitting material. Applying 5 V DC to the device generated a light emission of 80 cd/m².

EXAMPLE 4

An organic EL device was obtained as described in Example 1, except using Compound (6) as a light-emitting material. Applying 5 V DC to the device generated a light emission of 130 cd/m².

EXAMPLE 5

An organic EL device was obtained as described in Example 1, except using Compound (7) as a light-emitting material. Applying 5 V DC to the device generated a light emission of 120 cd/m².

EXAMPLE 6

An organic EL device was obtained as described in Example 1, except using Compound (9) as a light-emitting material. Applying 5 V DC to the device generated a light emission of 310 cd/m².

EXAMPLE 7

An organic EL device was obtained as described in Example 1, except using Compound (10) as a light-emitting material. Applying 5 V DC to the device generated a light emission of 260 cd/m².

EXAMPLE 8

An organic EL device was obtained as described in Example 1, except using Compound (11) as a light-emitting material. Applying 5 V DC to the device generated a light emission of 340 cd/m².

EXAMPLE 9

An organic EL device was obtained as described in Example 1, except using Compound (13) as a light-emitting material. Applying 5 V DC to the device generated a light emission of 460 cd/m².

EXAMPLE 10

An organic EL device was obtained as described in Example 1, except using Compound (14) as a light-emitting material. Applying 5 V DC to the device generated a light emission of 420 cd/m².

EXAMPLE 11

An organic EL device was obtained as described in Example 1, except using Compound (15) as a light-emitting material. Applying 5 V DC to the device generated a light emission of 470 cd/m².

EXAMPLE 12

An organic EL device was obtained as described in Example 1, except using Compound (17) as a light-emitting material. Applying 5 V DC to the device generated a light emission of 460 cd/m².

EXAMPLE 13

An organic EL device was obtained as described in Example 1, except using Compound (18) as a light-emitting material. Applying 5 V DC to the device generated a light emission of 500 cd/m².

EXAMPLE 14

An organic EL device was obtained as described in Example 1, except using Compound (19) as a light-emitting material. Applying 5 V DC to the device generated a light emission of 480 cd/m².

EXAMPLE 15

On a glass substrate, ITO was deposited as an anode by spattering, with a sheet resistance of 20 Ω/□. On the anode 40 nm thick light-emitting layer was formed by spin coating with a solution of Compound (9) in chloroform. Then, 200 nm thick cathode was formed by vacuum deposition of magnesium-silver alloy, to fabricate an organic EL device. Applying 5 V DC to the device generated a light emission of 130 cd/m².

EXAMPLE 16

Figure 2:
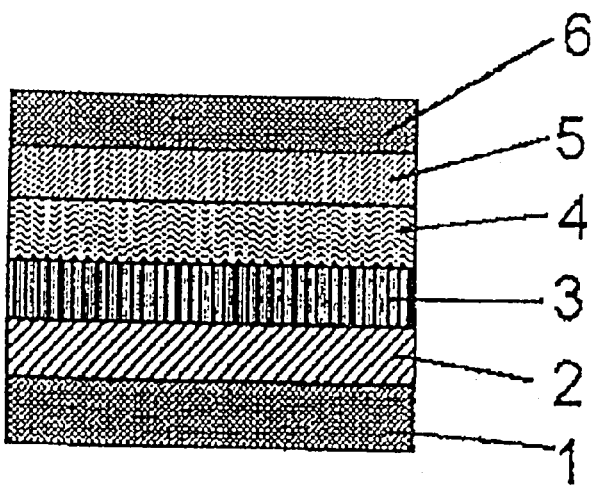
FIG. 2 is a cross section of another example of an organic EL device according to this invention.

FIG. 2 shows a cross section of the device employed in this example. The device is composed of an anode/a hole-transporting layer/a light-emitting layer/an electron-transporting layer/a cathode. On a glass substrate, ITO was deposited as an anode by spattering, with a sheet resistance of 20 Ω/□. On the anode, 50 nm thick hole-transporting layer was formed by vacuum deposition of N,N'-diphenyl-N,N'-bis(3-methylphenyl)-[1,1'-biphenyl]-4,4'-diamine [02]. Then, 40 nm thick light-emitting layer was formed by vacuum deposition of Compound (3). Then, 20 nm thick electron-transporting layer was formed by vacuum deposition of 2-(4-biphenyl)-5-(4-t-butylphenyl)-1,3,4-oxadiazole [07]. Then, 200 nm thick cathode was formed by vacuum deposition of magnesium-silver alloy, to obtain an organic EL device. Applying 10 V DC to the device generated a light emission of 3040 cd/m².

EXAMPLE 17

An organic EL device was obtained as described in Example 16, except using Compound (4) as a light-emitting material. Applying 10 V DC to the device generated a light emission of 2970 cd/m².

EXAMPLE 18

An organic EL device was obtained as described in Example 16, except using N,N'-diphenyl-N,N-bis(1-naphthyl)-1,1'-biphenyl)-4,4'-diamine [03] in a hole-transporting layer and bis{2-(4-t-butylphenyl)-1,3,4-oxadiazole}-m-phenylene [08] in an electron-transporting layer. Applying 10 V DC to the device generated a light emission of 3230 cd/m².

EXAMPLE 19

An organic EL device was obtained as described in Example 16, except using Compound [04] in a hole-transporting layer, Compound (5) in a light-emitting layer and Compound [11] in an electron-transporting layer. Applying 10 V DC to the device generated a light emission of 2760 cd/m².

EXAMPLE 20

An organic EL device was obtained as described in Example 16, except using Compound [05] in a hole-transporting layer, Compound (6) in a light-emitting layer and Compound [12] in an electron-transporting layer. Applying 10 V DC to the device generated a light emission of 3180 cd/m².

EXAMPLE 21

An organic EL device was obtained as described in Example 16, except using Compound (7) in a light-emitting layer. Applying 10 V DC to the device generated a light emission of 2700 cd/m².

EXAMPLE 22

An organic EL device was obtained as described in Example 16, except using Compound (9) in a light-emitting layer. Applying 10 V DC to the device generated a light emission of 3760 cd/m².

EXAMPLE 23

An organic EL device was obtained as described in Example 16, except using Compound (10) in a light-emitting layer. Applying 10 V DC to the device generated a light emission of 3690 cd/m².

EXAMPLE 24

An organic EL device was obtained as described in Example 16, except using Compound (11) in a light-emitting layer. Applying 10 V DC to the device generated a light emission of 3940 cd/m².

EXAMPLE 25

An organic EL device was obtained as described in Example 16, except using Compound (13) in a light-emitting layer. Applying 10 V DC to the device generated a light emission of 4360 cd/m².

EXAMPLE 26

An organic EL device was obtained as described in Example 16, except using Compound (14) in a light-emitting layer. Applying 10 V DC to the device generated a light emission of 4210 cd/m².

EXAMPLE 27

An organic EL device was obtained as described in Example 16, except using Compound (15) in a light-emitting layer. Applying 10 V DC to the device generated a light emission of 4460 cd/m².

EXAMPLE 28

An organic EL device was obtained as described in Example 16, except using Compound (17) in a light-emitting layer. Applying 10 V DC to the device generated a light emission of 3850 cd/m².

EXAMPLE 29

An organic EL device was obtained as described in Example 16, except using Compound (18) in a light-emitting layer. Applying 10 V DC to the device generated a light emission of 3930 cd/m².

EXAMPLE 30

An organic EL device was obtained as described in Example 16, except using Compound (19) in a light-emitting layer. Applying 10 V DC to the device generated a light emission of 3760 cd/m².

EXAMPLE 31

FIG. 2 shows a cross section of the device employed in this example. The device consists of an anode/a hole-transporting layer/a light-emitting layer/an electron-transporting layer/a cathode. On a glass substrate, ITO was deposited as an anode by spattering, with a sheet resistance of 20 Ω/□. On the anode 50 nm thick hole-transporting layer was formed by vacuum deposition of Compound [03], on which 50 nm thick light-emitting layer was formed by vacuum co-deposition of Compound [03] and Compound (4) (1:10 by weight). Then, 2-(4-biphenylyl)-5-(4-t-butylphenyl)-1,3,4-oxadiazole [07] was deposited to form 20 nm thick electron-transporting layer, by vacuum deposition. Then, magnesium-silver alloy was vacuum deposited to form 200 nm thick cathode, to obtain an organic EL device. Applying 10 V DC to the device generated a light emission of 3210 cd/m$^2$.

EXAMPLE 32

An organic EL device was obtained as described in Example 31, except using Compound (14) in place of Compound (4). Applying 10 V DC to the device generated a light emission of 3350 cd/m$^2$.

EXAMPLE 33

An organic EL device was obtained as described in Example 31, except using Compound (19) in place of Compound (4). Applying 10 V DC to the device generated a light emission of 2970 cd/m$^2$.

EXAMPLE 34

Figure 4:
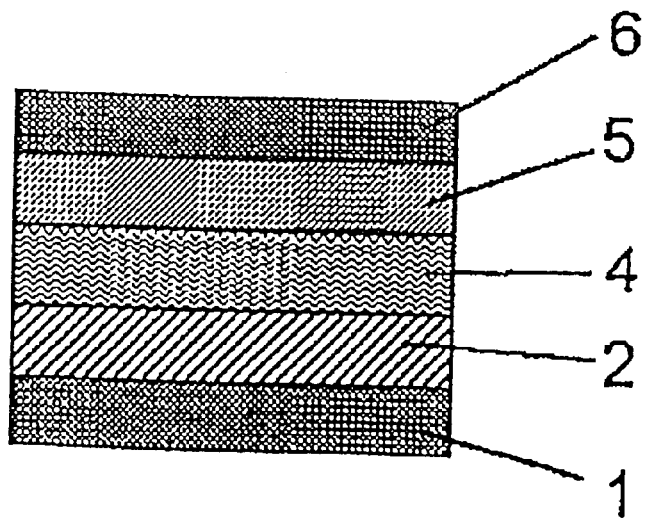
FIG. 4 is a cross section of another example of an organic EL device according to this invention.

FIG. 4 shows a cross section of the device employed in this example. The device consists of an anode/a light-emitting layer/an electron-transporting layer/a cathode. On a glass substrate, ITO was deposited as an anode by spattering, with a sheet resistance of 20 Ω/□. On the anode, 50 nm thick light-emitting layer was formed by vacuum co-deposition of N,N'-diphenyl-N,N-bis(1-naphthyl)-1,1'-biphenyl)-4,4'-diamine[03] and Compound (4) (1:10 by weight). Then, Compound [9] was vacuum deposited to form 50 nm thick electron-transporting layer. Then, magnesium-silver alloy was vacuum deposited to form 200 nm thick cathode to obtain an organic EL device. Applying 10 V DC to the device generated a light emission of 2160 cd/m$^2$.

EXAMPLE 35

An organic EL device was obtained as described in Example 34, except using Compound (6) in place of Compound (4). Applying 10 V DC to the device generated a light emission of 2370 cd/m$^2$.

EXAMPLE 36

An organic EL device was obtained as described in Example 34, except using Compound (9) in place of Compound (4). Applying 10 V DC to the device generated a light emission of 2290 cd/m$^2$.

EXAMPLE 37

An organic EL device was obtained as described in Example 34, except using Compound (14) in place of Compound (4). Applying 10 V DC to the device generated a light emission of 2900 cd/m$^2$.

EXAMPLE 38

An organic EL device was obtained as described in Example 34, except using Compound (15) in place of Compound (4). Applying 10 V DC to the device generated a light emission of 2860 cd/m$^2$.

EXAMPLE 39

An organic EL device was obtained as described in Example 34, except using Compound (17) in place of Compound (4). Applying 10 V DC to the device generated a light emission of 2740 cd/m$^2$.

EXAMPLE 40

An organic EL device was obtained as described in Example 34, except that a light-emitting layer was formed by vacuum deposition of Compound (19) to 40 nm. Applying 10 V DC to the device generated a light emission of 2880 cd/m$^2$.

EXAMPLE 41

On a glass substrate, ITO was deposited as an anode by spattering, with a sheet resistance of 20 Ω/□. On the anode, 40 nm thick light-emitting layer was formed by spin coating with a solution of Compound (11) and N,N'-diphenyl-N,N-bis(1-naphthyl)-1,1'-biphenyl)-4,4'-diamine[03] (1:10 molar ratio) in chloroform. Then, Compound [10] was vacuum deposited to form 50 nm thick electron-transporting layer. Then, magnesium-silver alloy was vacuum deposited to form 200 nm thick cathod, to obtain an organic EL device. Applying 10 V DC to the device generated a light emission of 1320 cd/m$^2$.

EXAMPLE 42

Figure 3:
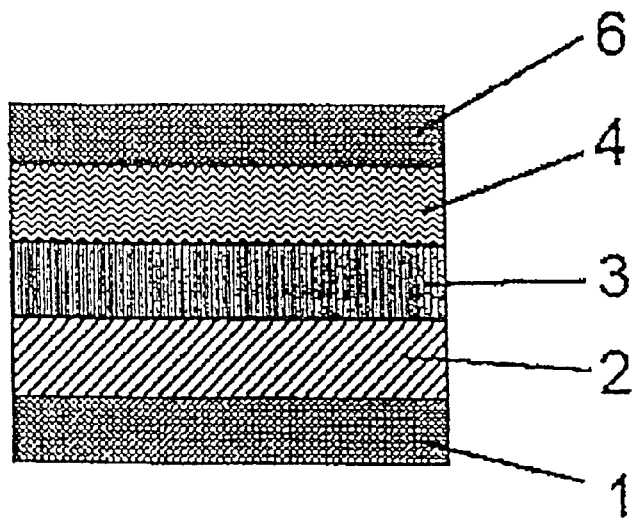
FIG. 3 is a cross section of another example of an organic EL device according to this invention.

FIG. 3 shows the cross section of the device employed in this example. The device consists of an anode/a hole-transporting layer/a light-emitting layer/a cathode. On a glass substrate, ITO was deposited as an anode by spattering, with a sheet resistance of 20 Ω/□. On the anode 50 nm thick hole-transporting layer was formed by vacuum deposition of N,N'-diphenyl-N,N-bis(1-naphthyl)-1,1'-biphenyl)-4,4'-diamine[03]. Then, Compounds [11] and (3) (20:1 by weight) were vacuum co-deposited to form 50 nm thick light-emitting layer. Then, magnesium-silver alloy was vacuum deposited to 200 nm thick cathode, to obtain an organic EL device. Applying 10 V DC to the device generated a light emission of 1340 cd/m$^2$.

EXAMPLE 43

An organic EL device was obtained as described in Example 42, except using Compound (6) in place of Compound (3). Applying 10VDC to the device generated a light emission of 1860 cd/m$^2$.

EXAMPLE 44

An organic EL device was obtained as described in Example 43, except using Compound (6) in place of Compound (4). Applying 10 V DC to the device generated a light emission of 1730 cd/m$^2$.

EXAMPLE 45

An organic EL device was obtained as described in Example 43, except using Compound (9) in place of Compound (4). Applying 10 V DC to the device generated a light emission of 1810 cd/m$^2$.

EXAMPLE 46

An organic EL device was obtained as described in Example 43, except using Compound (14) in place of Compound (4). Applying 10 V DC to the device generated a light emission of 1690 cd/m$^2$.

EXAMPLE 47

An organic EL device was obtained as described in Example 43, except using Compound (15) in place of Compound (4). Applying 10 V DC to the device generated a light emission of 1820 cd/m$^2$.

EXAMPLE 48

An organic EL device was obtained as described in Example 43, except using Compound (17) in place of Compound (4). Applying 10 V DC to the device generated a light emission of 1910 cd/m$^2$.

EXAMPLE 49

An organic EL device was obtained as described in Example 43, except using Compound (19) in place of Compound (4). Applying 10 V DC to the device generated a light emission of 1770 cd/m$^2$.

EXAMPLE 50

An organic EL device was obtained as described in Example 42, except using N,N'-diphenyl-N,N'-bis(3-methylphenyl)-[1,1'-biphenyl]-4,4'-diamine [02] in a hole-transporting layer and co-depositing in vacuo Compounds [13] and (6) (20:1 by weight) to form a light-emitting layer. Applying 10 V DC to the device generated a light emission of 2030 cd/m$^2$.

EXAMPLE 51

An organic EL device was obtained as described in Example 16, except using Compound (4) in a hole-transporting layer and Compound [13] in a light-emitting layer. Applying 10 V DC to the device generated a light emission of 1020 cd/m$^2$.

EXAMPLE 52

An organic EL device was obtained as described in Example 51, except using Compound (10) in a hole-transporting layer. Applying 10 V DC to the device generated a light emission of 1080 cd/m$^2$.

EXAMPLE 53

An organic EL device was obtained as described in Example 51, except using Compound (6) in a hole-transporting layer. Applying 10 V DC to the device generated a light emission of 930 cd/m$^2$.

EXAMPLE 54

An organic EL device was obtained as described in Example 51, except using Compound (15) in a hole-transporting layer. Applying 10 V DC to the device generated a light emission of 1360 cd/m$^2$.

EXAMPLE 55

An organic EL device was obtained as described in Example 16, except using N,N'-diphenyl-N,N-bis(1-naphthyl)-(1,1'-biphenyl)-4,4'-diamine [03] in a hole-transporting layer, Compound [13] in a light-emitting layer and Compound (3) in an electron-transporting layer. Applying 10 V DC to the device generated a light emission of 890 cd/m$^2$.

EXAMPLE 56

An organic EL device was obtained as described in Example 55, except using Compound (7) in an electron-transporting layer. Applying 10 V DC to the device generated a light emission of 680 cd/m$^2$.

EXAMPLE 57

An organic EL device was obtained as described in Example 55, except using Compound (14) in an electron-transporting layer. Applying 10 V DC to the device generated a light emission of 420 cd/m$^2$.

EXAMPLE 58

An organic EL device was obtained as described in Example 55, except using Compound (15) in an electron-transporting layer. Applying 10 V DC to the device generated a light emission of 670 cd/m$^2$.

EXAMPLE 59

An organic EL device was obtained as described in Example 55, except using Compound (18) in an electron-transporting layer. Applying 10 V DC to the device generated a light emission of 570 cd/m$^2$.

As described above, a compound of this invention may be used as a constituting material in an organic EL device to provide high intensity luminescence in comparison with a conventional device, indicating that this invention is significantly effective.

What is claimed is:

1. An organic electroluminescent device having one or more organic thin layers including a light-emitting layer between an anode and a cathode, wherein the light-emitting layer contains the compound represented by the general formula (1) in a form of a mixture or a single substance:

(1)

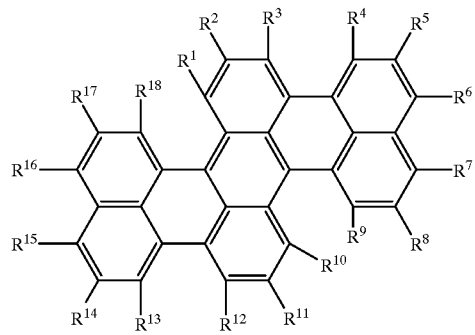

wherein $R^1$ to $R^{18}$ independently represent hydrogen atom, halogen atom, hydroxy group, a substituted or unsubstituted amino group, nitro group, cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or carboxyl group, and wherein any two of $R^1$ to $R^{18}$ may be combined together to form a ring, and at least one of $R^1$ to $R^{18}$ is a diarylamino group represented by —$NAr^1Ar^2$ wherein $Ar^1$ and $Ar^2$ independently represent a substituted or unsubstituted aryl group having 6 to 20 carbon atoms.

2. An organic electroluminescent device having one or more organic thin layers including a light-emitting layer between an anode and a cathode, wherein the light-emitting layer contains the compound represented by the general formula (2) in a form of a mixture or a single substance:

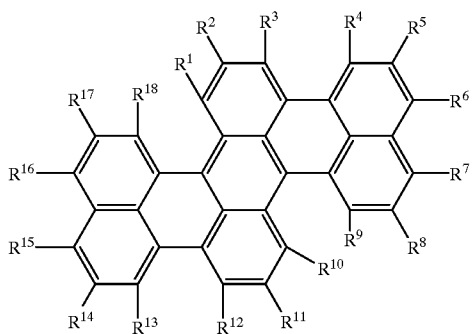

(2)

wherein $R^1$ to $R^{18}$ independently represent hydrogen atom, halogen atom, hydroxy group, a substituted or unsubstituted amino group, nitro group, cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or carboxyl group, and wherein any two of $R^1$ to $R^{18}$ may be combined together to form a ring, provided that at least one of $R^1$ to $R^{18}$ is a diarylamino group represented by $-NAr^1Ar^2$ wherein $Ar^1$ and $Ar^2$ independently represent a substituted or unsubstituted aryl group having 6 to 20 carbon atoms and at least one of $Ar^1$ and $A^2$ is substituted with a substituted or unsubstituted styryl group.

3. An organic electroluminescent device having one or more organic thin layers including a light-emitting layer between an anode and a cathode, wherein the organic thin layer contains at least an electron-transporting layer comprising the compound represented by the general formula (1) in a form of a mixture or a single substance:

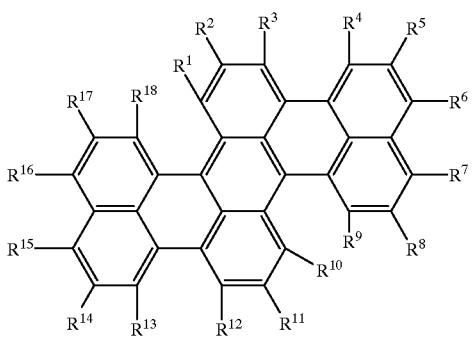

(1)

wherein $R^1$ to $R^{18}$ independently represent hydrogen atom, halogen atom, hydroxy group, a substituted or unsubstituted amino group, nitro group, cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or carboxyl group, and wherein any two of $R^1$ to $R^{18}$ may be combined together to form a ring, and at least one of $R^1$ to $R^{18}$ is a diarylamino group represented by $-NAr^1Ar^2$ wherein $Ar^1$ and $Ar^2$ independently represent a substituted or unsubstituted aryl group having 6 to 20 carbon atoms.

4. An organic electroluminescent device having one or more organic thin layers including a light-emitting layer between an anode and a cathode, wherein the organic thin layer contains at least an electron-transporting layer comprising the compound represented by the general formula (2) in a form of a mixture or a single substance:

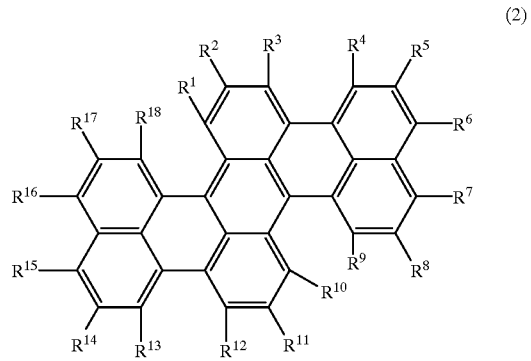

(2)

wherein $R^1$ to $R^{18}$ independent represent hydrogen atom, halogen atom, hydroxy group, a substituted or unsubstituted amino group, nitro group, cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or carboxyl group, and wherein any two of $R^1$ to $R^{18}$ may be combined together to form a ring, provided that at least one of $R^1$ to $R^{18}$ is a diarylamino group represented by $-NAr^1Ar^2$ wherein $Ar^1$ and $Ar^2$ independently represent a substituted or unsubstituted aryl group having 6 to 20 carbon atoms and at least one of $Ar^1$ and $Ar^2$ is substituted with a substituted or unsubstituted styryl group.

* * * * *